United States Patent [19]

Mikhael

[11] 4,123,712
[45] Oct. 31, 1978

[54] SYMMETRICAL POLYPHASE NETWORK

[75] Inventor: Wasfy B. Mikhael, Ottawa, Canada

[73] Assignee: Northern Telecom Limited, Montreal, Canada

[21] Appl. No.: 789,804

[22] Filed: Apr. 22, 1977

[51] Int. Cl.² ............................................. H04B 1/02
[52] U.S. Cl. .................................. 325/137; 325/330; 332/45; 323/122; 329/110; 333/70 CR
[58] Field of Search .................. 325/50, 137, 330; 323/122-125, 128; 332/45; 333/70 CR; 329/110, 133, 135

[56] References Cited

U.S. PATENT DOCUMENTS 3,559,042  1/1971  Gingell ................................. 323/122
3,618,133  11/1971  Gingell ................................. 332/45

OTHER PUBLICATIONS

"A Multi-Phase Method of SSB Generation", by Jordan, Sdelovaci Tech. (Czechoslovakia), vol. 24, No. 10, 10/1976.

Primary Examiner—Robert L. Griffin
Assistant Examiner—Jin F. NG
Attorney, Agent, or Firm—John E. Mowle

[57] ABSTRACT

A symmetrical polyphase R-C network, in which each section has a resistor serially connected between its input and output and a capacitor connected between the input of one section and the output of an adjacent section, has a second resistor connected in shunt with the output of each section to decrease the passband ripple of the network with negligible effect on the stopband response.

8 Claims, 9 Drawing Figures

SYMMETRICAL POLYPHASE NETWORK

This invention relates to an improvement in a symmetrical polyphase network which provides lower passband ripple and which is particularly adapted for, but not limited to, single sideband modulators and demodulators.

BACKGROUND OF THE INVENTION

Polyphase networks have been developed in conjunction with polyphase modulators for the generation of single sideband signals. U.S. Pat. No. 3,559,042 by Michael John Gingell issued Jan. 26, 1971 and entitled: "Polyphase Symmetrical Network" describes such a network. Application of these networks to single sideband modulators is described in an article also by Gingell entitled: "Single Sideband Modulation Using Sequence Asymmetric Polyphase Networks" Electrical Communication, Vol. 48 No. 1 and 2, pp 21-25, 1973. Utilizing digital signals to modulate or demodulate the analog input signal provides a practical analog modulator which is particularly adapted for use in frequency division multiplex transmission of telephone signals on carrier systems.

Utilizing a single polyphase network results in one having a notch at only one single frequency. However, as pointed out in both the article and patent by Gingell, by cascading "n" number of sections, having different notch frequencies $\omega_1$, $\omega_2$—$\omega_n$, a band of "n" different notch frequencies can be obtained. Utilizing the minimum number of cascaded sections to achieve the desired rejection band may result in a network which has an unacceptably high ripple in the passband. Such a network can be improved upon by adding still further cascaded sections which are so designed to reduce this passband ripple. However, such a solution is relatively expensive in terms of additional components.

Statement of the Invention

The present invention provides a significant reduction in the passband ripple of such a network and is achieved by connecting additional impedances in shunt therewith eliminating the need for the inclusion of whole sections.

Thus, in accordance with the present invention there is provided a symmetrical polyphase network having a plurality of symmetrical sections each comprising: an input, and an output terminal, and a first impedance having one phase angle connected between the input and output terminal of one of the sections. In addition, each section includes a second impedance having a different phase angle, connected between the input terminal of one section and the output terminal of a different section. The improvement in each of the sections comprises a third impedance connected effectively in shunt with the input or output terminals to decrease the passband ripple with negligible effect on the stopband response of the network.

In a particular embodiment, the circuit is constructed utilizing R-C components with the first and third impedances being resistors and the second impedances being capacitors; the third impedances being connected in shunt with the output of the network.

Various equivalent configurations of these third impedances can be utilized. For instance, they may be connected across adjacent outputs of the network. They may be connected across opposed outputs of the network, or, they may be connected from each output to a common terminal or ground. In addition, where a plurality of such networks are connected in cascade, a significant improvement in the passband ripple may be achieved by utilizing the third impedances in only one of the sections. In a practical embodiment, the improvement achieved by adding these third impedances to other sections is negligible in comparison to the ripple introduced as a result of the normal tolerances of the components themselves.

Since the networks are symmetrical, a similar improvement can be achieved by connecting the third impedance across the input terminals rather than the output terminals. If the overall network is driven from a low impedance source, resistive impedances can be connected in series rather than in shunt with the input. This has the added advantage of providing isolation between the input and output terminals of the overall network, particularly at high frequencies.

BRIEF DESCRIPTION OF THE DRAWINGS

Example embodiments of the invention will now be described with reference to the accompanying drawings in which.

DESCRIPTION OF THE PREFERRED EMBODIMENT

Figure 1:
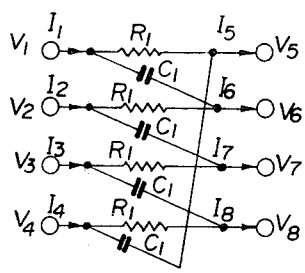
FIG. 1 is a schematic circuit diagram of a symmetrical four-phase network in accordance with the prior art.

In the following detailed description, the same reference characters will be used to identify corresponding elements in each section of a network. Where it is necessary to distinguish between these elements an additional reference character will be added. Normally however only the base reference character will be referred to.

Figure 2A:
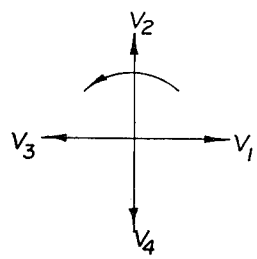
FIGS. 2a and 2b illustrate four-phase sets of ideal input voltages which may be applied to the circuit illustrated in FIG. 1.

In the prior art network of Gingell such as illustrated in FIG. 1, a four-phase set of input voltages having a positive sequence $V_1$ to $V_4$, as shown in FIG. 2a, is applied to the respective input terminals, of a four-phase network. Since the inputs are symmetric and the network is symmetric, the output has to be a symmetric sequence. It can be shown that the chain matrix for one path, for example for input $V_1$ referenced to ground, to output $V_5$ also referenced to ground, is given by:

$$\begin{bmatrix} V_1 \\ I_1 \end{bmatrix} = \frac{1}{G_1 - \omega C_1} \begin{bmatrix} G_1 + j\omega C_1 & 1 \\ 2j\omega C_1 G_1 & G_1 + j\omega C_1 \end{bmatrix} \begin{bmatrix} V_s \\ -I_s \end{bmatrix} \quad (1)$$

Figure 3:
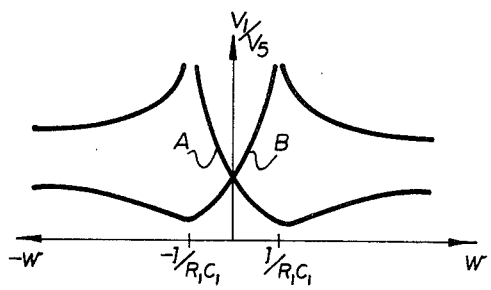
FIG. 3 illustrates typical response characteristics of the network illustrated in FIG. 1 when driven by the voltage sequences of FIG. 2.

And the open circuit voltage transfer function $T_{s1p}$ for a positive sequence of voltages $V_1$ to $V_4$ is given by:

$$T_{s1p} = \frac{V_s}{V_1}\bigg|_{I_s = 0} = \frac{1 - \omega/\omega_1}{1 + j\omega/\omega_1} \quad (2)$$

Where $\omega_1 = 1/(R_1C_1)$ and $G_1 = 1/R_1$. The frequency response is shown in FIG. 3, waveform A.

Figure 2B:
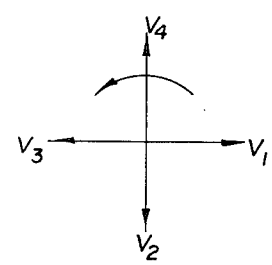

If a negative sequence of voltages $V_1$ to $V_4$, as shown in FIG. 2b is applied instead to the network, then the chain matrix becomes:

$$\begin{bmatrix} V_1 \\ I_1 \end{bmatrix} = \frac{1}{G_1 + \omega C_1} \begin{bmatrix} G_1 + j\omega C_1 & 1 \\ 2j\omega C_1 G_1 & G_1 + j\omega C_1 \end{bmatrix} \begin{bmatrix} V_s \\ -I_s \end{bmatrix} \quad (3)$$

and the transfer function $T_{s1n}$ is given by:

$$T_{s1n} = \frac{V_s}{V_1}\bigg|_{I_s = 0} = \frac{1 + \omega/\omega_1}{1 + j\omega/\omega_1} \quad (4)$$

The frequency response is shown in FIG. 3, waveform B. It is seen that the network is capable of discriminating between a positive and a negative input sequence in the frequency domain and that the negative sequence is completely nulled at $\omega = 1/R_1C_1$, while the positive sequence is nulled at $\omega = -1/R_1C_1$. It is important to point out that the network response to positive and negative sequences can be interchanged simply by interchanging the inputs $V_1$ and $V_3$, or inputs $V_2$ or $V_4$, or by interchanging the R's and C's in the network.

Figure 4:
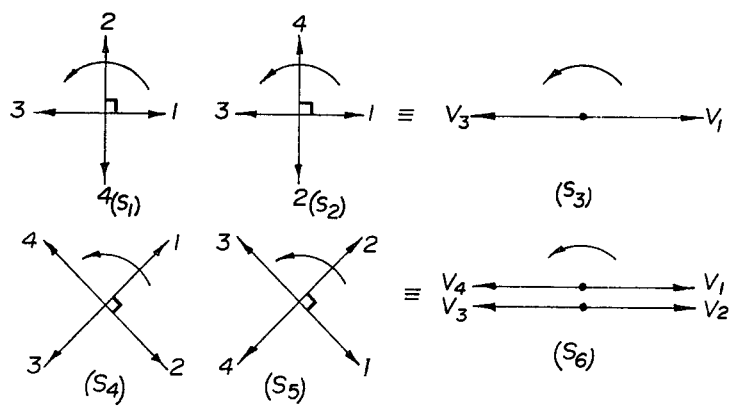
FIG. 4 illustrates typical four-phase sets of practical input voltages which may be applied to the four-phase networks.

In practice a symmetrical sequence of four signals is not used but this is actually what is required in the ideal case as an output sequence. Generally an unsymmetric input is used which can be resolved into these sequences. The network is required to pass the sequence(s) of one polarity and attenuate the other(s). To find a suitable input, the opposite procedure is performed. Since the input signals are of unsymmetrical form, they can be formed by adding at least two symmetrical sequences of different polarity. FIG. 4 illustrates two sets of practical inputs $S_3$ and $S_6$ which vectorily are derived from sequences $S_1$, $S_2$ and $S_4$, $S_5$ as shown.

Figure 5:
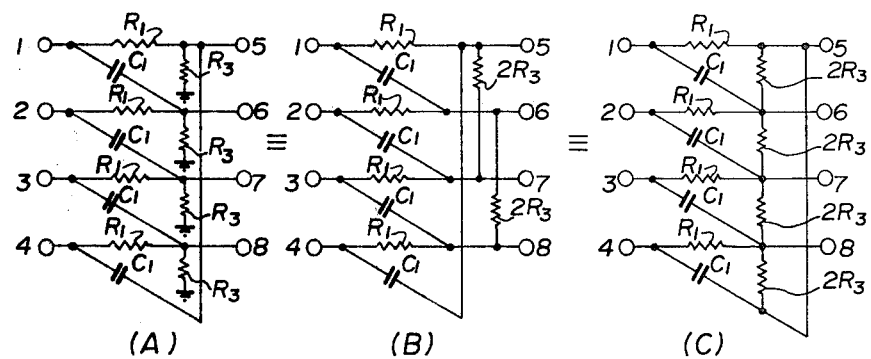
FIG. 5 illustrates three embodiments of a four-phase network each of which incorporates the improvement of the present invention.

A modified form of the four-phase network of FIG. 1 forms the basis of the present invention, and is shown in three equivalent embodiments in FIG. 5. The terminal performance (port parameters) of the three four-phase networks A, B and C is the same. The chain matrix of a single path for a negative symmetric input sequence in each of these embodiments is given by:

$$\begin{bmatrix} V_1 \\ I_1 \end{bmatrix} = \quad (5)$$

$$\frac{1}{G_1 + \omega C_1} \begin{bmatrix} G_1 + G_3 + j\omega C_1 & 1 \\ G_1 G_3 + sC_1 G_3 + 2j\omega C_1 G_1 & G_1 + j\omega C_1 \end{bmatrix} \begin{bmatrix} V_s \\ I_s \end{bmatrix}$$

Where corresponding elements have the same reference characters as in FIG. 1, and $G_3 = 1/R_3$.

Comparing equations (1) and (3) with (5), it can be seen that the additional shunt resistor (having a conductance $G_3$) influences the denominator of the open circuit voltage transfer function without affecting the numerator and consequently the finite zeros of transmission. This is also true for a multistage network. Although in the present case shunt R's were helpful in achieving the passband specification, shunt C's can generally be used as well. The input sequences of FIG. 4 to the single stage network in FIGS. 1 or 5 produce an output sequence which is ideal only at one frequency $\omega = 1/R_1C_1$ and approximates an ideal sequence over a narrow frequency range about $\omega = 1/R_1C_1$. By cascading a number of sections, n, having different notch frequencies $\omega_7, \omega_2 \ldots \omega_n$, as taught by Gingell, the unwanted sequence is nulled completely n times at those notch frequencies.

Figure 6:
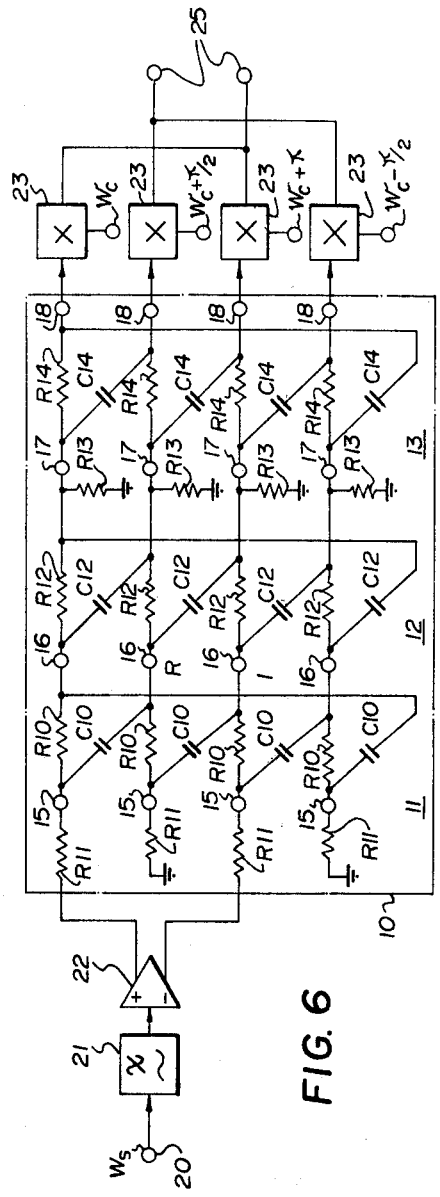
FIG. 6 is a schematic circuit diagram of a single sideband modulator incorporating the improved four-phase networks of the invention.

A multistage network using the inventive concepts will now be described with reference to FIGS. 6 and 7. Referring to FIG. 6, the multistage network 10 used in the single sideband modulator comprises three symmetrical four-phase networks 11, 12 and 13 connected in tandem; each network being defined by the column of elements connected between the small circles with the output of one network being connected to the input of the next.

The four-phase network 11 has four symmetrically connected sections each comprising input terminals 15 and output terminals 16. In each section, a resistor R10 is connected between its input and output terminal 15 and 16. In addition, a capacitor C10 is connected between the input terminal 15 of one section and the output terminal 16 of an adjacent section. The improvement in this network is a third resistor R11 which is connected in series with each input. These series resistors R11 function in the same manner as resistors R3 illustrated in embodiment (A) of FIG. 5.

The outputs 16 also act as the inputs for the following four-phase network 12 each section of which includes series connected resistors R12 and cross-connected capacitors C12. However, each of the third resistors R13 in this network are connected to ground. Again, these resistors R13 function in the same manner as those in (A) of FIG. 5.

Figure 8:
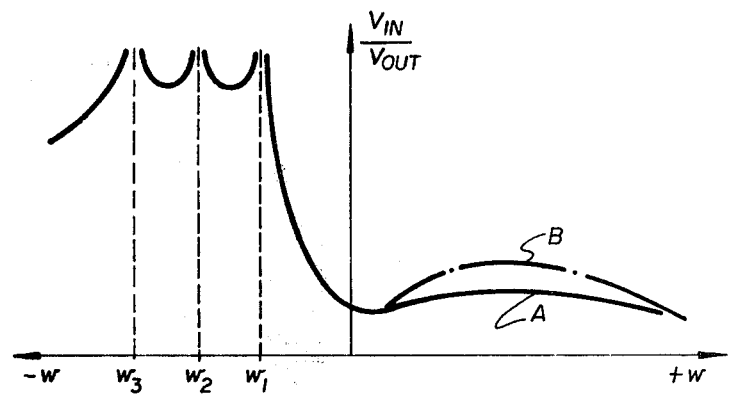
FIG. 8, located on the same sheet as FIG. 5, illustrates typical waveforms showing the improved response obtained from the four-phase networks shown in FIGS. 6 and 7.

In the third network 13, again, series resistors R14 and cross-connected capacitors C14 are connected between its inputs 17 and outputs 18. However, unlike the first two networks 11 and 12, the additional resistors which comprise the improvement of the present invention are not used in this stage. Utilizing these additional resistors in each of the networks results in diminishing returns, as under practical conditions the component tolerances will negate any theoretical improvement which might be obtained beyond one or two stages. A typical frequency response for such a cascaded network is shown in FIG. 8 with (A) and without (B) the compensating resistors.

The R-C products of the cascaded networks 11, 12 and 13, determine the location of the transmission zeros and consequently almost entirely the rejection in the unwanted band as follows:

$$\omega_1 = \frac{1}{R_{10}C_{10}}$$

$$\omega_2 = \frac{1}{R_{12}C_{12}}$$

$$\omega_3 = \frac{1}{R_{14}C_{14}}$$

The passband is determined by the R-C products as well as the R-C ratios (i.e the numerator and denominator of the voltage transfer function). To improve the passband within practical component ratios, some of the degrees of freedom to control the pole locations, using the grounded R's ($R_{11}$ or $R_{13}$) or shunt R's are used. As mentioned above there is no point in using all the degrees of freedom offered by these elements to improve the passband beyond practical limits since the limiting factor is the system's requirements and the component tolerances.

The balance of the single sideband modulator comprises an input 20 for coupling an input modulation signal $\omega_s$ through a low-pass filter 21 and a phase-splitter and buffer amplifier 22, to opposed inputs of the network 10. The other two inputs are connected to common terminals or ground. The signals from each of the four outputs 18 of the three stage network 10 are connected to separate multipliers 23 in which pulse signals at the carrier frequency $\omega_c$ having a 90° phase relationship between adjacent sections are applied thereto. In a typical application, digital switching techniques would be used to control the application of these pulse signals to the multipliers 23. In this embodiment, the duty cycle of the pulse signals is 0.5 with the outputs of the modulators 23 being combined as shown to provide a single sideband signal at the balanced output 25 of the modulator in a well known manner. This arrangement helps to reduce the unwanted second harmonic distortion. However in an alternate embodiment a duty cycle for the pulse signals of 0.25 may be used with all four outputs being summed directly into a single ended output.

Figure 7:
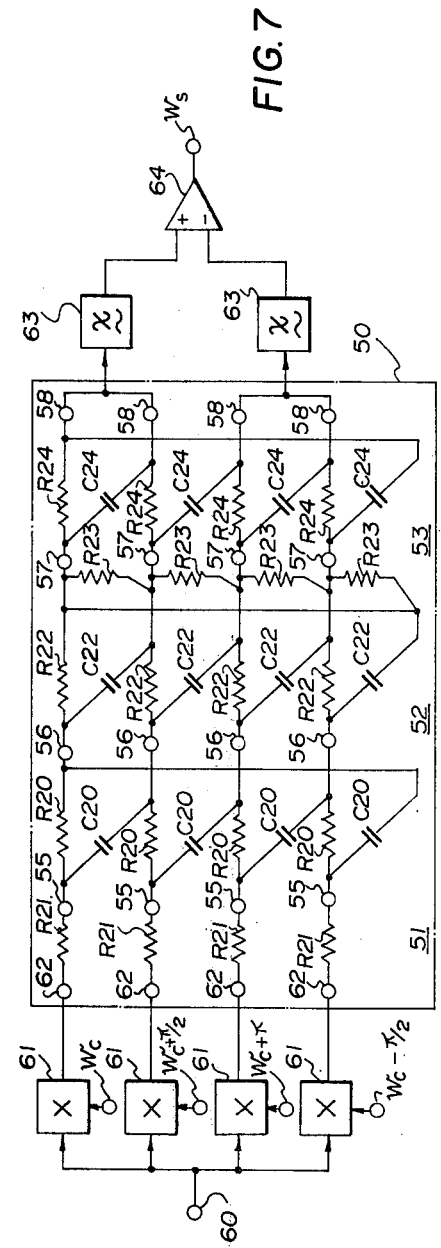
FIG. 7 is a schematic circuit diagram of a single sideband demodulator also incorporating the improved four-phase networks of the invention.

Referring to FIG. 7, the multi-stage network 50 used in the single sideband demodulator comprises three symmetrical four-phase networks 51, 52 and 53 connected in tandem; each network being defined by the column of elements connected between the small circles with the output of one network being connected to the input of the next.

The four-phase network 51 has four symmetrically connected sections each comprising: input terminals 55 and output terminals 56 across which are connected the series resistors R20 and cross-connected capacitors C20 in a manner similar to that described with reference to the network 10. Similarly, the two additional tandem connected stages 52 and 53 having additional inputs and outputs 57 and 58, also include series connected resistors R22 and R24 and cross-connected capacitors C22 and C24 respectively.

In addition, the four-phase network 51 includes series compensating resistors R21 connected in series with the input of each section. It will be understood that the resistors R21 perform a similar function to those shown in FIG. 6 which results in a substantial reduction in passband ripple of the network. In addition network 52 includes compensating resistors R23 which function in a similar manner to resistors R13. However, resistors R23 are connected as shown in (C) of FIG. 5 and consequently their value will be twice that which would result if they were connected as in (A) of FIG. 5.

The balance of the demodulator comprises an input 60 for connecting a modulated single sideband signal in-phase to four separate multipliers 61 in which pulse signals $\omega_c$ at the carrier frequency having a 90° phase relationship between adjacent sections are applied thereto, again a well known manner. Because the modulated input signal is fed in-phase to all four multipliers 61 a duty cycle for the pulse signals of 0.25 is used. However, as with the modulator, a duty cycle for the pulse signals of 0.5 may be used if the input 60 is split and fed differentially to the four multipliers 61. The outputs from the multipliers 61 are fed to the four inputs 62 of the network 51. The four outputs of the network 50 are combined and coupled through two low-pass filters 63 and after being fed through differential amplifier 64 provide a demodulated output signal $\omega_2$ from the single sideband demodulator.

What is claimed is:

1. In a symmetrical polyphase network having a plurality of symmetrical sections each comprising:
   an input and an output;
   a first impedance having one phase angle, connected between the input and output of an associated one of said sections,
   a second impedance having a different phase angle, connected between the input of said associated one section and the output of a different section;
   the improvement comprising:
   a third impedance in each of said sections connected in shunt with said output to decrease the passband ripple with negligible effect on the stopband response of the network.

2. A network as defined in claim 1 in which in each section:
   the first impedance is a resistor, the second impedance is a capacitor and the third impedance is a resistor.

3. A network as defined in claim 1 in which each of the third impedances is connected between a pair of outputs.

4. A network as defined in claim 1 in which each of the third impedances is connected between an output and a common terminal.

5. A network as defined in claim 1 in which signals applied to adjacent sections of the network are adjacent in phase.

6. A network as defined in claim 1 for use in a single sideband demodulator additionally comprising:
   means for modulating a single sideband modulated signal with a symmetrical polyphase carrier signal, the modulated outputs of which are applied to each input of the network; and
   means for summing the outputs of the network.

7. A network as defined in claim 1 for use in a single sideband modulator which additionally includes means for applying a symmetrical polyphase modulating signal to said inputs;
   means for modulating each of said outputs with a symmetrical polyphase carrier signal; and
   means for summing the modulated signals to produce a single sideband modulated signal.

8. A network as defined in claim 7 in which each input has a fourth resistor connected in series therewith to isolate the inputs and outputs from each other.

* * * * *